(12) United States Patent
Zhang et al.

(10) Patent No.: US 11,805,520 B2
(45) Date of Patent: Oct. 31, 2023

(54) METHOD AND DEVICE FOR TRANSMITTING SIDELINK SIGNAL

(71) Applicant: Samsung Electronics Co., Ltd., Suwon-si (KR)

(72) Inventors: Shichang Zhang, Beijing (CN); Yingyang Li, Beijing (CN); Yi Wang, Beijing (CN); Min Wu, Beijing (CN)

(73) Assignee: Samsung Electronics Co., Ltd., Suwon-si (KR)

( * ) Notice: Subject to any disclaimer, the term of this patent is extended or adjusted under 35 U.S.C. 154(b) by 616 days.

(21) Appl. No.: 16/968,995

(22) PCT Filed: Feb. 12, 2019

(86) PCT No.: PCT/KR2019/001666
§ 371 (c)(1),
(2) Date: Aug. 11, 2020

(87) PCT Pub. No.: WO2019/156529
PCT Pub. Date: Aug. 15, 2019

(65) Prior Publication Data
US 2021/0029688 A1    Jan. 28, 2021

(30) Foreign Application Priority Data
Feb. 12, 2018    (CN) .......................... 201810148199.0

(51) Int. Cl.
*H04W 72/20* (2023.01)
*H04W 4/40* (2018.01)
(Continued)

(52) U.S. Cl.
CPC ............. *H04W 72/20* (2023.01); *H04L 5/001* (2013.01); *H04L 5/0044* (2013.01);
(Continued)

(58) Field of Classification Search
CPC ....... H04W 72/20; H04W 4/40; H04W 52/52; H04W 72/0446; H04W 72/0453;
(Continued)

(56) References Cited

U.S. PATENT DOCUMENTS

2013/0329839 A1*  12/2013  Kobayashi ........... H03G 3/3078
                                                375/345
2016/0036519 A1*   2/2016  Loomis ................... G01S 19/41
                                                370/316
(Continued)

FOREIGN PATENT DOCUMENTS

WO    2017/048064 A1    3/2017
WO    2017/052489 A1    3/2017
(Continued)

OTHER PUBLICATIONS

LG Electronics: "Discussion on sidelink resource allocation and pool configuration for IoT", 3GPP Draft; R1-1707584 Discussion on Sidelink Resource, Allocation and Pool Configuration for IoT and Wearables, 3rd Generation Partnership Project (3GPP), Mobile Competence Centre; 650, Route Des Luc, vol. RAN WG1, No. Hangzhou; May 15, 2017-May 19, 2017, XP051272792, May 14, 2017.

(Continued)

*Primary Examiner* — Hardikkumar D Patel
(74) *Attorney, Agent, or Firm* — Jefferson IP Law, LLP

(57) ABSTRACT

The present disclosure relates to a pre-5th-Generation (5G) or 5G communication system to be provided for supporting higher data rates Beyond 4th-Generation (4G) communication system such as Long Term Evolution (LTE). The present disclosure provides a method for transmitting a sidelink signal. The method comprises: determining a Physical Sidelink Control CHannel (PSCCH) transmission mode allowed in a PSCCH transmission resource pool and a Physical Sidelink Shared CHannel (PSSCH) transmission (Continued)

mode allowed in a PSSCH transmission resource pool, respectively; determining a resource for transmitting a PSCCH and a resource for transmitting a PSSCH from the PSCCH transmission resource pool and the PSSCH transmission resource pool respectively; and transmitting the PSCCH according to the determined PSCCH transmission mode and the resource for transmitting the PSCCH and transmitting the PSSCH according to the determined PSSCH transmission mode and the resource for transmitting the PSSCH. The present disclosure also provides a corresponding device and storage media.

13 Claims, 4 Drawing Sheets

(51) Int. Cl.
    *H04L 5/00*          (2006.01)
    *H04W 52/52*        (2009.01)
    *H04W 72/0446*     (2023.01)
    *H04W 72/0453*     (2023.01)
    *H04W 72/53*        (2023.01)

(52) U.S. Cl.
    CPC .......... *H04L 5/0053* (2013.01); *H04L 5/0058* (2013.01); *H04W 4/40* (2018.02); *H04W 52/52* (2013.01); *H04W 72/0446* (2013.01); *H04W 72/0453* (2013.01); *H04W 72/53* (2023.01)

(58) Field of Classification Search
    CPC ....... H04W 72/53; H04W 4/70; H04W 76/14; H04W 72/02; H04W 72/23; H04L 5/001; H04L 5/0044; H04L 5/0053; H04L 5/0058; H04L 5/0007; H04L 5/0094; H03G 3/3078

See application file for complete search history.

(56) References Cited

U.S. PATENT DOCUMENTS

| | | |
|---|---|---|
| 2017/0094657 A1* | 3/2017 | Yoon ..................... H04L 5/0012 |
| 2017/0188391 A1 | 6/2017 | Rajagopal et al. |
| 2017/0264401 A1 | 9/2017 | Soong et al. |
| 2017/0311315 A1 | 10/2017 | Islam et al. |
| 2018/0241508 A1 | 8/2018 | Chervyakov et al. |
| 2019/0141675 A1 | 5/2019 | Blasco Serrano et al. |
| 2019/0200377 A1* | 6/2019 | Li ..................... H04W 72/1263 |
| 2020/0296738 A1* | 9/2020 | Inokuchi ............... H04W 72/21 |
| 2021/0112505 A1* | 4/2021 | Li ....................... H04L 27/2607 |

FOREIGN PATENT DOCUMENTS

| | | |
|---|---|---|
| WO | 2017/171519 A1 | 10/2017 |
| WO | 2017/178993 A1 | 10/2017 |

OTHER PUBLICATIONS

European Search Report dated Feb. 17, 2021, issued in European Application No. 19750791.6.
Chinese Office Action dated Mar. 13, 2023, issued in Chinese Application No. 2018101481990.

* cited by examiner

METHOD AND DEVICE FOR TRANSMITTING SIDELINK SIGNAL

TECHNICAL FIELD

The present disclosure relates to the field of mobile communication technologies, and in particular, to a method, device and storage medium for transmitting a sidelink signal.

BACKGROUND ART

To meet the demand for wireless data traffic having increased since deployment of 4G communication systems, efforts have been made to develop an improved 5G or pre-5G communication system. Therefore, the 5G or pre-5G communication system is also called a 'Beyond 4G Network' or a 'Post LTE System'. The 5G communication system is considered to be implemented in higher frequency (mmWave) bands, e.g., 60 GHz bands, so as to accomplish higher data rates. To decrease propagation loss of the radio waves and increase the transmission distance, the beamforming, massive multiple-input multiple-output (MIMO), Full Dimensional MIMO (FD-MIMO), array antenna, an analog beam forming, large scale antenna techniques are discussed in 5G communication systems. In addition, in 5G communication systems, development for system network improvement is under way based on advanced small cells, cloud Radio Access Networks (RANs), ultra-dense networks, device-to-device (D2D) communication, wireless backhaul, moving network, cooperative communication, Coordinated Multi-Points (CoMP), reception-end interference cancellation and the like. In the 5G system, Hybrid FSK and QAM Modulation (FQAM) and sliding window superposition coding (SWSC) as an advanced coding modulation (ACM), and filter bank multi carrier (FBMC), non-orthogonal multiple access (NOMA), and sparse code multiple access (SCMA) as an advanced access technology have been developed.

The Internet, which is a human centered connectivity network where humans generate and consume information, is now evolving to the Internet of Things (IoT) where distributed entities, such as things, exchange and process information without human intervention. The Internet of Everything (IoE), which is a combination of the IoT technology and the Big Data processing technology through connection with a cloud server, has emerged. As technology elements, such as "sensing technology", "wired/wireless communication and network infrastructure", "service interface technology", and "Security technology" have been demanded for IoT implementation, a sensor network, a Machine-to-Machine (M2M) communication, Machine Type Communication (MTC), and so forth have been recently researched. Such an IoT environment may provide intelligent Internet technology services that create a new value to human life by collecting and analyzing data generated among connected things. IoT may be applied to a variety of fields including smart home, smart building, smart city, smart car or connected cars, smart grid, health care, smart appliances and advanced medical services through convergence and combination between existing Information Technology (IT) and various industrial applications.

In line with this, various attempts have been made to apply 5G communication systems to IoT networks. For example, technologies such as a sensor network, Machine Type Communication (MTC), and Machine-to-Machine (M2M) communication may be implemented by beamforming, MIMO, and array antennas. Application of a cloud Radio Access Network (RAN) as the above-described Big Data processing technology may also be considered to be as an example of convergence between the 5G technology and the IoT technology.

In the 3GPP standards, the direct communication link between devices is called a Sidelink. Similar to the uplink and downlink, there are also control channels and data channels over the sidelink, wherein the former is called Physical Sidelink Control CHannel (PSCCH), and the latter is called Physical Sidelink Shared CHannel (PSSCH). The PSCCH is used to indicate the time-frequency domain resource location of the PSSCH transmission, the modulation and coding scheme, and the priorities of data carried in the PSSCH. The PSSCH is used to carry data.

DISCLOSURE OF INVENTION

Technical Problem

Some sidelink communication technologies are based on the LTE system architecture. However, with the release of the New Radio (NR) technical standard, the sidelink communication technology can also be applied to the NR system. The LTE system and the NR system have different requirements for the sidelink communication technology (e.g., the subcarrier spacing). However, there is no sidelink signal transmission scheme that can adapt to these different requirements.

To this end, there is a need for a sidelink signal transmission scheme that can adapt to the different requirements of different systems.

Solution to Problem

In order to at least partially solve or alleviate the above problems, embodiments of the present disclosure provide a method, device and computer storage medium for transmitting a sidelink signal.

According to a first aspect of the present disclosure, a method for transmitting a sidelink signal is provided. The method comprises: determining a Physical Sidelink Control CHannel (PSCCH) transmission mode allowed in a PSCCH transmission resource pool and a Physical Sidelink Shared CHannel (PSSCH) transmission mode allowed in a PSSCH transmission resource pool, respectively; determining a resource for transmitting a PSCCH and a resource for transmitting a PSSCH from the PSCCH transmission resource pool and the PSSCH transmission resource pool respectively; and transmitting the PSCCH according to the determined PSCCH transmission mode and the resource for transmitting the PSCCH and transmitting the PSSCH according to the determined PSSCH transmission mode and the resource for transmitting the PSSCH.

In some embodiments, the allowed PSCCH transmission mode and the allowed PSSCH transmission mode comprise a subcarrier spacing, the PSCCH transmission resource pool allows only one subcarrier spacing for one carrier frequency, and the PSSCH transmission resource pool allows more than one subcarrier spacing for one carrier frequency.

In some embodiments, a first subcarrier spacing is used for transmitting the PSSCH when a target coverage of traffic transmitted using the sidelink signal is greater than a predetermined threshold, and a second subcarrier spacing is used for transmitting the PSSCH when the target coverage of traffic transmitted using the sidelink signal is no great than the predetermined threshold, and wherein the first subcarrier spacing is smaller than the second subcarrier spacing.

In some embodiments, a first subcarrier spacing is used for transmitting the PSSCH when a current congestion level in the PSSCH transmission resource pool is greater than a predetermined threshold, and a second subcarrier spacing is used for transmitting the PSSCH when the current congestion level in the PSSCH transmission resource pool is no great than the predetermined threshold.

In some embodiments, the method further comprises: indicating the subcarrier spacing for the PSSCH in the transmitted PSCCH.

In some embodiments, the subcarrier spacing used for transmitting the PSSCH is same as the subcarrier spacing used for transmitting the PSCCH. The subcarrier spacing used for transmitting the PSSCH is determined based on the carrier frequency of the traffic transmitted using the sidelink signal.

In some embodiments, the allowed PSCCH transmission mode and the allowed PSSCH transmission mode comprise a cyclic prefix (CP). In such a case, the CP used for transmitting the PSCCH is same as the CP used for transmitting the PSSCH. Alternatively, the CP used for transmitting the PSCCH is an extended CP, and the CP used for transmitting the PSSCH is a normal CP.

In some embodiments, the transmission power in adjustment time for Automatic Gain Control (AGC) is equal to the transmission power in the latest one Orthogonal Frequency Division Multiplexing (OFDM) or Single-Carrier Frequency-Division Multiple Access (SC-FDMA) symbol.

In some embodiments, the PSCCH and the PSSCH are multiplexed in a frequency division mode, wherein each PSCCH occupies half a time slot, and the number of symbols occupied by the PSSCH depends on the subcarrier spacing for the PSSCH. Alternatively, the PSCCH and the PSSCH are multiplexed in a time division mode, wherein a start of a first PSCCH symbol in one slot is after the Automatic Gain Control (AGC) time.

In some embodiments, transmitting the PSCCH according to the determined PSCCH transmission mode and the resource for transmitting the PSCCH and transmitting the PSSCH according to the determined PSSCH transmission mode and the resource for transmitting the PSSCH, comprising: when starting to transmit the PSCCH and the PSSCH at the ith symbol in the nth slot, the start time for transmitting the PSCCH and the PSSCH is in advance of the start of the ith OFDM or SC-FDMA symbol in the nth downlink slot by a specific time amount. In some examples, the specific time amount is Δ seconds:

$$\Delta = D/C,$$

where D is a distance between the user equipment (UE) and the base station being a reference synchronization source, C is the speed of light and has a value of 3×108 m/s, and the value of D is calculated by the UE using current Global Positioning System (GNSS) coordinates of the UE and GNSS coordinates of the base station being the reference synchronization source.

According to a second aspect of the present disclosure, a device for transmitting a sidelink signal is provided. The device comprises a transmission mode determining module, a resource determining module and a transmitting module. The transmission mode determining module is configured to determine a Physical Sidelink Control CHannel (PSCCH) transmission mode allowed in a PSCCH transmission resource pool and a Physical Sidelink Shared CHannel (PSSCH) transmission mode allowed in a PSSCH transmission resource pool, respectively. The resource determining module is configured to determine a resource for transmitting a PSCCH and a resource for transmitting a PSSCH from the PSCCH transmission resource pool and the PSSCH transmission resource pool respectively. The transmitting module is configured to transmit the PSCCH according to the determined PSCCH transmission mode and the resource for transmitting the PSCCH and transmit the PSSCH according to the determined PSSCH transmission mode and the resource for transmitting the PSSCH.

According to a third aspect of the present disclosure, A device for transmitting a sidelink signal is provided. The device comprises a processor and a memory. The memory stores instructions which, when executed by the processor, cause the processor to perform any one of the methods mentioned above.

According to a fourth aspect of the present disclosure, a computer readable storage medium storing instructions is provided, wherein the instructions, when executed by a processor, enable the processor to perform the method according to the first aspect of the present disclosure.

Advantageous Effects of Invention

With the solutions of the embodiments of the present disclosure, it is possible to transmit sidelink signals of different systems using different resources satisfying different requirements by allowing a device (e.g., a UE) to select different resources (e.g., different subcarrier spacing) for transmitting the PSSCH/PSCCH from one resource pool.

BRIEF DESCRIPTION OF DRAWINGS

These and/or other aspects and advantages of the present disclosure will become more apparent and understandable from the following detailed description of some of the embodiments described with reference to the accompanying drawings wherein.

MODE FOR THE INVENTION

Figure 1:
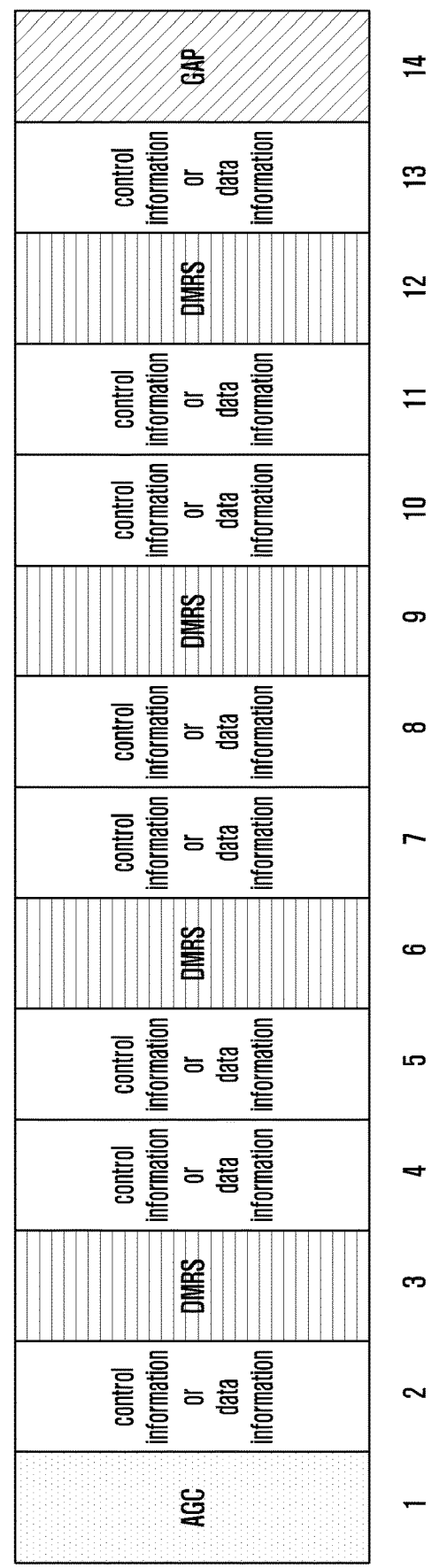
FIG. 1 shows a schematic diagram of the structure of a PSCCH and PSSCH subframe in the V2X technology.

Hereinafter, preferred embodiments of the present disclosure will be described in detail with reference to the accompanying drawings. The details and functions that are not necessary for the present disclosure are omitted in the description to avoid obscuring the subject matters of the present disclosure. In the present specification, the various embodiments described below for describing the principles of the present disclosure are merely illustrative and should not be construed as limiting the scope of the disclosure. The following description with reference to the accompanying drawings is intended to facilitate to thoroughly understand the illustrative embodiments of the present disclosure defined by the claims and equivalents thereof. The following description includes numerous specific details to facilitate understanding, but these details are merely for illustration.

Accordingly, it will be apparent to those skilled in the art that various changes and modifications may be made to the embodiments described herein without departing from the scope and spirit of the disclosure. In addition, descriptions of well-known functions and constructions are omitted for clarity and conciseness. Further, same reference numerals are used throughout the drawings for same or similar functions and operations. In addition, all or part of the functions, features, units, modules, and the like described in the following various embodiments may be combined, deleted, and/or modified to form new embodiments, and these embodiments still fall within the scope of the present disclosure. Moreover, as used in the present disclosure, the terms "comprising", "including" and their derivatives are intended to be inclusive and not limiting.

The control information and data may be transmitted over a sidelink in the Vehicle to Vehicle/Pedestrian/Infrastructure/Network (V2X). The application context of the embodiments of the present disclosure will be described below by taking the V2X communication as an example. However, it should be understood that the embodiments of the present disclosure may be applied to any application or service that needs to use sidelink transmission. In addition, although the technical background involved in the technical solutions of the embodiments of the present disclosure is discussed based on the LTE system and the NR system, the technical solutions described herein may also be applied to any communication technology or communication protocol using the sidelink communication which is currently available or will be developed in the future.

In the 3GPP Rel-14 standards and the ongoing 3GPP Rel-15 standards (hereinafter, the V2X technology in the 3GPP Rel-14 and 3GPP Rel-15 is simply referred to as the existing V2X technology), the V2X communication is based on the LTE system framework, wherein both the PSSCH and PSCCH adopt the physical structure of the Physical Uplink Shared CHannel (PUSCH), wherein in the time domain, the minimum time unit is Ts=1/15000/2048 second(s), the length of each Single-Carrier Frequency-Division Multiple Access (SC-FDMA) symbol is 2048 Ts, and the length of a minimum time resource unit is 1 millisecond (ms), i.e. one subframe. FIG. 1 schematically shows a schematic diagram of the structure of a PSCCH and PSSCH subframe in the V2X technology. As shown in FIG. 1, one subframe includes two slots, each slot has a length of 0.5 ms, and each slot contains 7 SC-FDMA symbols. In the existing V2X technology, SC-FDMA symbols only use normal Cyclic Prefix (CP), wherein, in the 7 symbols of each slot, the length of the cyclic prefix of the first symbol is 166 Ts, and the lengths of the cyclic prefixes of other symbols than the first symbol are each 144 Ts. In one subframe, the first SC-FDMA symbol is used for Automatic Gain Control (AGC), the last symbol is used as a guard interval (GAP), the third, sixth, ninth and twelfth symbols are used to transmit Demodulation Reference Signals (DMRS), and the remaining symbols are used to transmit control information (for PSCCH) or data information (for PSSCH). In the frequency domain, one subcarrier spacing is 15 kHz, the minimum frequency domain resource unit is one physical resource block (PRB), and each PRB contains 12 subcarriers, which are of 180 kHz in total. In addition, in the existing V2X technology, a PSCCH and PSSCH(s) scheduled by the PSCCH are always transmitted on different PRBs of a same subframe.

Due to the limitations of the LTE system in terms of the operating frequency, system bandwidth, physical channel structure, and data transmission mechanism, the existing V2X technology cannot fully satisfy the requirements of the 3GPP's newly defined applications such as the Platooning, Advanced Driving, and Extended Sensors, in terms of the data rate and data transmission reliability. For example, in the application scenario of the Extended Sensor, the data rate may reach 1G bps, which cannot be satisfied in the LTE system. With the release of the NR technology standard, the cellular communication system has been significantly improved in terms of the peak rate, system capacity, and data transmission reliability compared to the LTE. It is a unanimous appeal in the industry to implement the sidelink communication in the NR system to further enhance the performance of the V2X. One of the main features of the NR system is its ability to operate at higher carrier frequencies, e.g. above 60 GHz. The spectrum resources in this frequency band are very rich, so it is possible to transmit data with a bandwidth of hundreds of megahertz or even gigahertz, possibly achieving a significant increase in terms of the data rate.

However, the structure of the sidelink physical channel in the LTE system is not applicable to the higher carrier frequencies because the subcarrier spacing for the LTE system is only 15 kHz, which cannot withstand the inter-carrier interference in the environment of the higher carrier frequencies. In the case of a bandwidth up to gigabit, if the subcarrier spacing remains 15 kHz, the computation amount of the Inverse Discrete Fourier Transform (IDFT) required to generate an SC-FDAM symbol is also unacceptable for the existing hardware.

Hereafter, the technical solutions according to embodiments of the present disclosure will be explained for specific examples. In the following description, unless otherwise specified, the OFDM or SC-FDMA symbols occupied by the PSCCH refer to the OFDM or SC-FDMA symbols corresponding to the subcarrier spacing used by the current PSCCH, and the OFDM or SC-FDMA symbols occupied by the PSSCH refer to the OFDM or SC-FDMA symbols corresponding to the subcarrier spacing used by the current PSSCH.

Figure 2:
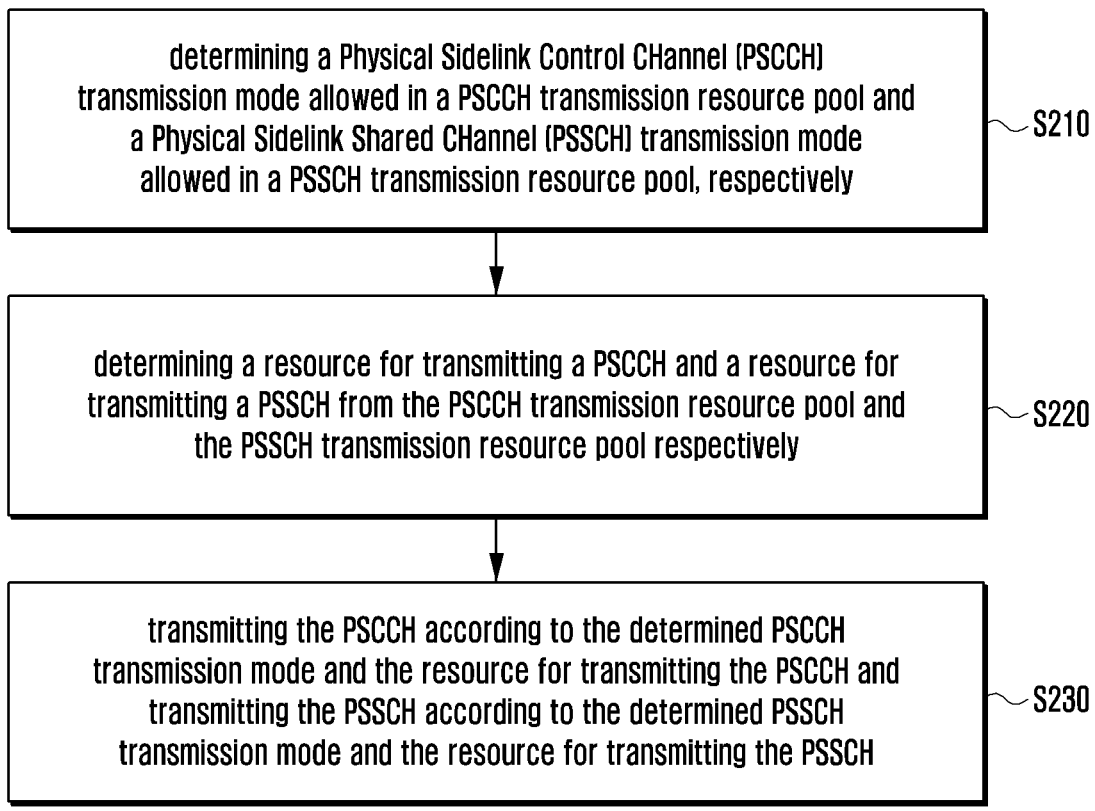
FIG. 2 shows a schematic flowchart of a method for transmitting a sidelink signal in accordance with an embodiment of the present disclosure.

To solve the problems of the prior art, a method for transmitting a sidelink signal according to an embodiment of the present disclosure is provided. FIG. 2 shows a schematic flowchart of a method for transmitting a sidelink signal according to an embodiment of the present disclosure. The method may be performed by a User Equipment (UE). It should be noted that the UE herein may refer to any device capable of performing the technical solutions described herein, and is not limited to user equipments defined in, for example, LTE or NR systems.

As shown in FIG. 2, in operation S210, a Physical Sidelink Control CHannel (PSCCH) transmission mode allowed in a PSCCH transmission resource pool and a Physical Sidelink Shared CHannel (PSSCH) transmission mode allowed in a PSSCH transmission resource pool are determined, respectively.

As used herein, the PSCCH transmission resource pool refers to a set of transmission modes and time-frequency resources that may be used for transmitting the PSCCH, and the PSSCH transmission resource pool refers to a set of transmission modes and time-frequency resources that may be used for transmitting the PSSCH. The transmission mode in the PSCCH transmission resource pool or the transmission mode in the PSSCH transmission resource pool may comprise at least one of the following parameters: time-frequency resource locations comprised in the transmission resource pool, PSCCH or PSSCH sub-carrier spacings allowed in the transmission resource pool, and PSCCH or PSSCH multiplexing modes in the transmission resource pool, PSCCH or PSSCH CP lengths allowed in the transmission resource pool, numbers and locations of PSCCH or PSSCH DMRS symbols allowed in the transmission resource pool, PSCCH or PSSCH transmission timing employed in the transmission resource pool, and PSCCH and PSSCH waveforms employed in the transmission resource pool, and etc...... The transmission timing may be downlink timing of a base station, uplink timing of a base station, or global positioning system (GNSS) timing. The waveforms may be of Orthogonal Frequency Division Multiplexing (OFDM) or SC-FDMA. The UE may determine a transmission mode from the transmission resource pool by receiving signaling from the base station or by a pre-configuration. In some examples, the transmission mode may also be referred to as "configuration". For example, a configuration in the PSCCH transmission resource pool may refer to a PSCCH transmission mode allowed in the PSCCH transmission resource pool. A configuration in the PSSCH transmission resource pool may refer to a PSSCH transmission mode in the PSSCH transmission resource pool.

In operation S220, the resource for transmitting the PSCCH and the resource for transmitting the PSSCH from the PSCCH transmission resource pool and the PSSCH transmission resource pool are determined respectively.

In operation S230, the PSCCH is transmitted according to the determined PSCCH transmission mode and the resource for transmitting the PSCCH and the PSSCH is transmitted according to the determined PSSCH transmission mode and the resource for transmitting the PSSCH.

At least one of the following parameters may be determined and used to transmit the PSCCH/PSSCH: the subcarrier spacing, the CP length, the number and location of DMRS symbols, the transmission timing, and the waveform, and the like. If a parameter in the configuration of the PSCCH or PSSCH transmission resource pool can take multiple values, the UE may select a value from the multiple values according to a specific rule, which may be configured by the base station, pre-configured or defined by a standard.

In some embodiments, the allowed PSCCH transmission mode and the allowed PSSCH transmission mode comprise a subcarrier spacing, the PSCCH transmission resource pool allows only one subcarrier spacing for one carrier frequency, and the PSSCH transmission resource pool allows more than one subcarrier spacing for one carrier frequency.

In some embodiments, a first subcarrier spacing is used for transmitting the PSSCH when a target coverage of traffic transmitted using the sidelink signal is greater than a predetermined threshold, and a second subcarrier spacing is used for transmitting the PSSCH when the target coverage of traffic transmitted using the sidelink signal is no great than the predetermined threshold, and wherein the first subcarrier spacing is smaller than the second subcarrier spacing.

In some embodiments, a first subcarrier spacing is used for transmitting the PSSCH when a current congestion level in the PSSCH transmission resource pool is greater than a predetermined threshold, and a second subcarrier spacing is used for transmitting the PSSCH when the current congestion level in the PSSCH transmission resource pool is no great than the predetermined threshold.

In some embodiments, the method further comprises: indicating the subcarrier spacing for the PSSCH in the transmitted PSCCH.

In some embodiments, the subcarrier spacing used for transmitting the PSSCH is same as the subcarrier spacing used for transmitting the PSCCH. The subcarrier spacing used for transmitting the PSSCH is determined based on the carrier frequency of the traffic transmitted using the sidelink signal.

In some embodiments, the allowed PSCCH transmission mode and the allowed PSSCH transmission mode comprise a cyclic prefix (CP). In such a case, the CP used for transmitting the PSCCH is same as the CP used for transmitting the PSSCH. Alternatively, the CP used for transmitting the PSCCH is an extended CP, and the CP used for transmitting the PSSCH is a normal CP.

In some embodiments, the transmission power in adjustment time for Automatic Gain Control (AGC) is equal to the transmission power in the latest one Orthogonal Frequency Division Multiplexing (OFDM) or Single-Carrier Frequency-Division Multiple Access (SC-FDMA) symbol.

In some embodiments, the PSCCH and the PSSCH are multiplexed in a frequency division mode, wherein each PSCCH occupies half a time slot, and the number of symbols occupied by the PSSCH depends on the subcarrier spacing for the PSSCH. Alternatively, the PSCCH and the PSSCH are multiplexed in a time division mode, wherein a start of a first PSCCH symbol in one slot is after the Automatic Gain Control (AGC) time.

In some embodiments, transmitting the PSCCH according to the determined PSCCH transmission mode and the resource for transmitting the PSCCH and transmitting the PSSCH according to the determined PSSCH transmission mode and the resource for transmitting the PSSCH, comprising: when starting to transmit the PSCCH and the PSSCH at the $i^{th}$ symbol in the $n^{th}$ slot, the start time for transmitting the PSCCH and the PSSCH is in advance of the start of the $i^{th}$ OFDM or SC-FDMA symbol in the $n^{th}$ downlink slot by a specific time amount. In some examples, the specific time amount is Δ seconds:

$$\Delta = D/C,$$

where D is a distance between the user equipment (UE) and the base station being a reference synchronization source, C is the speed of light and has a value of 3×108 m/s, and the value of D is calculated by the UE using current Global Positioning System (GNSS) coordinates of the UE and GNSS coordinates of the base station being the reference synchronization source.

In order to facilitate to understand the embodiments of the present disclosure, the foregoing technical solutions according to the embodiments of the present disclosure will be further described below in a mode of interaction between devices, in conjunction with a specific application scenario.

Embodiment I

In this embodiment, the subcarrier spacing for the PSCCH may be different from the subcarrier spacing for the PSSCH scheduled by the PSCCH, and the PSCCH and the PSSCH scheduled by the PSCCH are multiplexed in a frequency division mode, that is, the time-frequency resource for the PSCCH and the time-frequency resource for the PSSCH scheduled by the PSCCH completely overlap in the time domain, but do not overlap at all in the frequency domain. In this embodiment, the carrier frequency is in range R11. The range R11 may be determined by the UE according to a configuration from the base station, a pre-configuration or a standard definition. One feasible mechanism is that the range R11 is defined by the standard as below 6 GHz or below 6.5 GHz. The PSCCH transmission resource pool may allow only one subcarrier spacing. The UE may determine the one PSCCH subcarrier spacing allowed in the resource pool according to the configuration information of the PSCCH transmission resource pool. Allowing only one subcarrier spacing in the PSCCH transmission resource pool is helpful for reducing the complexity of the PSCCH detection by the receiving UE.

The resource pool for the PSSCH scheduled by the PSCCH allows multiple subcarrier spacings. In some examples, the PSSCH resource pool allows two subcarrier spacings, and the UE may determine specific values of the two subcarrier spacings according to a configuration from the base station, a pre-configuration or a standard definition. The transmitting UE may select the subcarrier spacing for the PSSCH according to a specific rule. One feasible rule is that: the UE determines the subcarrier spacing used for the PSSCH according to the transmitted traffic. If the target coverage of the transmitted traffic is greater than a certain threshold T11, the UE adopts a smaller one of the subcarrier spacings currently allowed in the PSSCH transmission resource pool, otherwise the UE adopts a larger one of the subcarrier spacings currently allowed in the PSSCH transmission resource pool. Another feasible rule is that: when the current congestion level in the transmission resource pool is greater than a certain threshold T12, the UE adopts a larger one of the subcarrier spacings currently allowed in the PSSCH transmission resource pool. The UE may determine T11 and T12 according to a configuration from the base station, a pre-configuration or a standard definition. The transmitting UE may also determine the multiple PSSCH subcarrier spacings allowed in the resource pool according to the configuration information of the PSSCH transmission resource pool.

According to the first implementation of the present embodiment, the UE determines the subcarrier spacings and slot structures for the PSCCH and the PSSCH in the following manner:

If the carrier frequency belongs to the first carrier frequency range R11, the subcarrier spacing allowed in the PSCCH transmission resource pool is 15 kHz, and the subcarrier spacings allowed in the resource pool for the PSSCH scheduled by the PSSCH are 15 kHz and 30 kHz. The PSCCH may be transmitted using an OFDM or SC-FDMA waveform with the normal CP. Each slot contains 14 symbols. Each PSCCH occupies half a slot, i.e., the $1^{st}$ to $7^{th}$ OFDM or SC-FDMA symbols in one slot or the $8^{th}$ to $14^{th}$ OFDM or SC-FDMA symbols in one slot, wherein the CP length of the first symbol in the half slot for transmitting the PSCCH is 160 Ts, and the CP lengths of the remaining 6 symbols are each 144 Ts. The first half of the first symbol (i.e., 1096 Ts) in the half slot may be used to receive the Automatic Gain Control (AGC) for the UE, and the second half of the last symbol in the half slot (i.e., 1096 Ts) may be used as a GAP for switching between transmitting and receiving, during which the transmitting UE may transmit no signals.

If the subcarrier spacing for the PSSCH scheduled by the PSCCH is 15 kHz, each PSSCH occupies half a slot, i.e., the $1^{st}$ to $7^{th}$ OFDM or SC-FDMA symbols in one slot or the $8^{th}$ to $14^{th}$ OFDM or SC-FDMA symbols in one slot, wherein the CP length of the first symbol in the half slot for transmitting the PSSCH is 160 Ts, and the CP lengths of the remaining 6 symbols are each 144 Ts. The first half of the first symbol (i.e., 1096 Ts) in the half slot may be used to receive the Automatic Gain Control (AGC) for the UE, and the second half of the last symbol in the half slot (i.e., 1096 Ts) may be used as a GAP for switching between transmitting and receiving, during which the transmitting UE may transmit no signals.

If the subcarrier spacing for the PSSCH scheduled by the PSCCH is 30 kHz, each PSSCH occupies one slot, i.e., 14 OFDM or SC-FDMA symbols, wherein the CP lengths of the first and eighth symbols are each 144 k·½·$T_c$+16 k·$T_c$, and the CP lengths of the remaining 12 symbols are each 144 k·½·$T_c$, wherein k=64 (the same below), and Tc=1/(480000.4096) second (the same below). The first symbol of the PSSCH may be used to receive the Automatic Gain Control (AGC) for the UE, and the last symbol of the PSSCH is used as a GAP for switching between transmitting and receiving, during which the transmitting UE may transmit no signals.

According to the second implementation of the present embodiment, the UE determines the subcarrier spacings and slot structures for the PSCCH and the PSSCH in the following manner:

If the carrier frequency belongs to the first carrier frequency range R11, the subcarrier spacing allowed in the PSCCH transmission resource pool is 30 kHz, and the subcarrier spacings allowed in the resource pool for the PSSCH scheduled by the PSSCH are 30 kHz and 60 kHz. The PSCCH may be transmitted using an OFDM or SC-FDMA waveform, wherein each of the symbols has an extended CP, i.e. each slot contains 12 OFDM or SC-FDMA symbols. Each PSCCH occupies half a slot, i.e., the $1^{st}$ to $6^{th}$ OFDM or SC-FDMA symbols in one slot or the $7^{th}$ to $12^{th}$ OFDM or SC-FDMA symbols in one slot, wherein the CP length of each symbol is 512 k·½·$T_c$. The first half of the first symbol (i.e., 640 Ts) in the half slot may be used to receive the Automatic Gain Control (AGC) for the UE, and the second half of the last symbol in the half slot (i.e., 640 Ts) may be used as a GAP for switching between transmitting and receiving, i.e. the second half of the $6^{th}$ symbol of the PSCCH (i.e., 640 Ts) may be used as a switching interval, during which the transmitting UE may transmit no signals.

If the subcarrier spacing for the PSSCH scheduled by the PSCCH is 30 kHz, each PSSCH occupies half a slot, i.e., the $1^{st}$ to $6^{th}$ OFDM or SC-FDMA symbols in one slot or the $7^{th}$ to $12^{th}$ OFDM or SC-FDMA symbols in one slot, wherein the CP length of each symbol is 512 k·½·$T_c$. The first half of the first symbol (i.e., 640 Ts) in the half slot may be used to receive the Automatic Gain Control (AGC) for the UE, and the second half of the last symbol in the half slot (i.e., 640 Ts) may be used as a GAP for switching between transmitting and receiving, i.e. the second half of the $6^{th}$ symbol of the PSCCH (i.e., 640 Ts) may be used as a switching interval, during which the transmitting UE may transmit no signals.

If the subcarrier spacing for the PSSCH scheduled by the PSCCH is 60 kHz, each PSSCH occupies one slot, i.e., 12 OFDM or SC-FDMA symbols, wherein the CP length of each symbol is 512 k·½·$T_c$. The first symbol of the PSSCH may be used to receive the Automatic Gain Control (AGC) for the UE, and the last symbol (i.e., the $12^{th}$ symbol) may be used as a switching interval, during which the transmitting UE may transmit no signals.

In some examples, if more than one PSSCH subcarrier spacings are allowed in the resource pool, the scheduled PSSCH subcarrier spacing should be indicated in the PSCCH.

In this embodiment, if the UE uses the downlink synchronization signal transmitted by the base station as the reference synchronization source, and the UE starts to transmit the PSCCH and the PSSCH at the $i^{th}$ symbol in the $n^{th}$ slot, the start time for the UE transmitting the PSCCH and the PSSCH should be in advance of the start of the $i^{th}$ OFDM or SC-FDMA symbol in the $n^{th}$ downlink slot by Δ second(s). According to one implementation of the present embodiment, Δ=D/C, where D is the distance between the UE and the base station, C is the speed of light, i.e. 3×108 m/s. The value of D may be calculated by the RRC or MAC layer of the UE using the current GNSS coordinates of the UE and the GNSS coordinates of the base station, wherein the UE may acquire the GNSS coordinates of the base station by receiving the broadcast message from the base station. According to another implementation of the present embodiment of the present disclosure, $\Delta=(T_{UE}-T_{NB}) \mod L$, where $T_{UE}$ is the UTC timing corresponding to the start of the $n^{th}$ downlink slot at the UE side, and the $T_{NB}$ is the reference UTC timing obtained by the UE receiving the broadcast message from the base station. In some examples, the reference UTC timing is a start of a certain system frame of the base station in the history, L is the length of the slot, and the units of both of $(T_{UE}-T_{NB})$ and L are $T_c$.

Embodiment II

In this embodiment, the subcarrier spacing for the PSCCH may be different from the subcarrier spacing for the PSSCH scheduled by the PSCCH, and the PSCCH and the PSSCH scheduled by the PSCCH are multiplexed in a frequency division mode, that is, the time-frequency resource for the PSCCH and the time-frequency resource for the PSSCH scheduled by the PSCCH completely overlap in the time domain, but do not overlap at all in the frequency domain. In this embodiment, the carrier frequency is in range R21. The range R21 may be determined by the UE according to a configuration from the base station, a pre-configuration or a standard definition. One feasible mechanism is that the range R21 is defined by the standard as above 6 GHz or above 6.5 GHz. The PSCCH transmission resource pool may allow only one subcarrier spacing. The UE may determine the one PSCCH subcarrier spacing allowed in the resource pool according to the configuration information of the PSCCH transmission resource pool. Allowing only one subcarrier spacing in the PSCCH transmission resource pool is helpful for reducing the complexity of the PSCCH detection by the receiving UE.

The resource pool for the PSSCH scheduled by the PSCCH allows multiple subcarrier spacings. In some examples, the PSSCH resource pool allows two subcarrier spacings, and the UE may determine specific values of the two subcarrier spacings according to a configuration from the base station, a pre-configuration or a standard definition. The transmitting UE may select the subcarrier spacing for the PSSCH according to a specific rule. One feasible rule is that: the UE determines the subcarrier spacing used for the PSSCH according to the transmitted traffic. If the target coverage of the transmitted traffic is greater than a certain threshold T21, the UE adopts a smaller one of the subcarrier spacings currently allowed in the PSSCH transmission resource pool, otherwise the UE adopts a larger one of the subcarrier spacings currently allowed in the PSSCH transmission resource pool. Another feasible rule is that: when the current congestion level in the transmission resource pool is greater than a certain threshold T22, the UE adopts a larger one of the subcarrier spacings currently allowed in the PSSCH transmission resource pool. The UE may determine T21 and T22 according to a configuration from the base station, a pre-configuration or a standard definition. The transmitting UE may also determine the PSSCH subcarrier spacings allowed in the resource pool according to the configuration information of the PSSCH transmission resource pool.

One feasible implementation is described as below. If the carrier frequency belongs to the second carrier frequency range R21, the subcarrier spacing allowed in the PSCCH transmission resource pool is 60 kHz, and the subcarrier spacings allowed in the resource pool for the PSSCH scheduled by the PSSCH are 60 kHz and 120 kHz. The PSCCH may be transmitted using an OFDM or SC-FDMA waveform with the extended CP, i.e. each slot contains 12 OFDM or SC-FDMA symbols. Each PSCCH occupies half a slot, i.e., the $1^{st}$ to $6^{th}$ OFDM or SC-FDMA symbols in one slot or the $7^{th}$ to $12^{th}$ OFDM or SC-FDMA symbols in one slot, wherein the CP length of each symbol is $512 \text{ k} \cdot \frac{1}{2} \cdot T_c$. The first half of the first symbol (i.e., 320 Ts) in the half slot may be used to receive the Automatic Gain Control (AGC) for the UE, and the second half of the last symbol in the half slot (i.e., 320 Ts) may be used as a GAP for switching between transmitting and receiving, i.e. the second half of the $6^{th}$ symbol of the PSCCH (i.e., 320 Ts) may be used as a switching interval, during which the transmitting UE may transmit no signals.

If the subcarrier spacing for the PSSCH scheduled by the PSCCH is 60 kHz, each PSSCH occupies half a slot, i.e., the $1^{st}$ to $6^{th}$ OFDM or SC-FDMA symbols in one slot or the $7^{th}$ to $12^{th}$ OFDM or SC-FDMA symbols in one slot, the CP length of each symbol is $512 \text{ k} \cdot \frac{1}{2} \cdot T_c$. The first half of the first symbol (i.e., 320 Ts) in the half slot may be used to receive the Automatic Gain Control (AGC) for the UE, and the second half of the last symbol in the half slot (i.e., 320 Ts) may be used as a GAP for switching between transmitting and receiving, i.e. the second half of the $6^{th}$ symbol of the PSCCH (i.e., 320 Ts) may be used as a switching interval, during which the transmitting UE may transmit no signals.

If the subcarrier spacing for the PSSCH scheduled by the PSCCH is 120 kHz, each PSSCH occupies one slot, i.e., 12 OFDM or SC-FDMA symbols, wherein the CP length of each symbol is $512 \text{ k} \cdot \frac{1}{2} \cdot T_c$. The first symbol of the PSSCH may be used to receive the Automatic Gain Control (AGC) for the UE, and the last symbol (i.e., the $12^{th}$ symbol) may be used as a switching interval, during which the transmitting UE may transmit no signals.

In some examples, if more than one PSSCH subcarrier spacings are allowed in the resource pool, the scheduled PSSCH subcarrier spacing should be indicated in the PSCCH.

In this embodiment, if the UE uses the downlink synchronization signal transmitted by the base station as the reference synchronization source, and the UE starts to transmit the PSCCH and the PSSCH at the $i^{th}$ symbol in the $n^{th}$ slot, the start time for the UE transmitting the PSCCH and the PSSCH should be in advance of the start of the $i^{th}$ OFDM or SC-FDMA symbol in the $n^{th}$ downlink slot by Δ second(s). According to one implementation of the present embodiment, Δ=D/C, where D is the distance between the UE and the base station, C is the speed of light, i.e. 3×108 m/s. The value of D may be calculated by the RRC or MAC layer of the UE using the current GNSS coordinates of the UE and the GNSS coordinates of the base station, wherein the UE may acquire the GNSS coordinates of the base station by receiving the broadcast message from the base station. According to another implementation of the present embodiment of the present disclosure, $\Delta=(T_{UE}-T_{NB}) \mod L$, where $T_{UE}$ is the UTC timing corresponding to the start of the $n^{th}$ downlink slot at the UE side, and the $T_{NB}$ is the reference UTC timing obtained by the UE receiving the broadcast message from the base station. In some examples, the reference UTC timing is a start of a certain system frame of the base station in the history, L is the length of the slot, and the units of both of ($T_{UE}-T_{NB}$) and L are $T_c$.

Embodiment III

In this embodiment, the subcarrier spacing for the PSCCH is same as the subcarrier spacing for the PSSCH scheduled by the PSCCH, and the PSCCH and the PSSCH scheduled by the PSCCH are multiplexed in a frequency division mode, that is, the time-frequency resource for the PSCCH and the time-frequency resource for the PSSCH scheduled by the PSCCH completely overlap in the time domain, but do not overlap at all in the frequency domain. The UE may determine the subcarrier spacings allowed in the PSCCH resource pool and in the PSSCH resource pool according to a specific rule. One possible rule is that: the UE determines the allowed subcarrier spacing according to the carrier frequency range in which the current carrier is located. The UE may also determine one or more subcarrier spacings allowed in the PSCCH and PSSCH resource pools according to the configuration information of the PSCCH transmission resource pool and the configuration information of the PSSCH transmission resource pool.

If multiple subcarrier spacings are allowed in the PSCCH resource pool and in the PSSCH resource pool, the transmitting UE may select the subcarrier spacing for the PSCCH and the PSSCH according to a specific rule. One feasible rule is that: the UE determines the subcarrier spacing used for the PSSCH and the PSSCH according to the transmitted traffic. If the target coverage of the transmitted traffic is greater than a certain threshold T31, the UE adopts a smaller one of the subcarrier spacings currently allowed in the PSCCH and PSSCH transmission resource pools, otherwise the UE adopts a larger one of the subcarrier spacings currently allowed in the PSCCH and PSSCH transmission resource pools. Another feasible rule is that: when the current congestion level in the transmission resource pools is greater than a certain threshold T32, the UE adopts a larger one of the subcarrier spacings currently allowed in the PSCCH and PSSCH transmission resource pools. The UE may determine T31 and T32 according to a configuration from the base station, a pre-configuration or a standard definition.

In this embodiment, the CP lengths of the PSCCH and the PSSCH scheduled by the PSCCH may be same, so as to reduce the complexity of the system implementation. Alternatively, the PSCCH adopts an extended CP (long CP), and the PSSCH adopts a normal CP, thereby facilitating to improve both the coverage of the PSCCH and the resource utilization efficiency of the PSSCH.

In this embodiment, if the UE uses the downlink synchronization signal transmitted by the base station as the reference synchronization source, and the UE starts to transmit the PSCCH and the PSSCH at the $i^{th}$ symbol in the $n^{th}$ slot, the start time for the UE transmitting the PSCCH and the PSSCH should be in advance of the start of the $i^{th}$ OFDM or SC-FDMA symbol in the $n^{th}$ downlink slot by $\Delta$ second(s). According to one implementation of the present embodiment, $\Delta=D/C$, where D is the distance between the UE and the base station, C is the speed of light, i.e. 3×108 m/s. The value of D may be calculated by the RRC or MAC layer of the UE using the current GNSS coordinates of the UE and the GNSS coordinates of the base station, wherein the UE may acquire the GNSS coordinates of the base station by receiving the broadcast message from the base station. According to another implementation of the present embodiment of the present disclosure, $\Delta=(T_{UE}-T_{NB}) \bmod L$, where $T_{UE}$ is the UTC timing corresponding to the start of the $n^{th}$ downlink slot at the UE side, and the $T_{NB}$ is the reference UTC timing obtained by the UE receiving the broadcast message from the base station. In some examples, the reference UTC timing is a start of a certain system frame of the base station in the history, L is the length of the slot, and the units of both of ($T_{UE}-T_{NB}$) and L are $T_c$.

Embodiment IV

In this embodiment, the subcarrier spacing for the PSCCH may be different from the subcarrier spacing for the PSSCH scheduled by the PSCCH, and the PSCCH and the PSSCH scheduled by the PSCCH are multiplexed in a time division mode, that is, the time-frequency resource for the PSCCH and the time-frequency resource for the PSSCH scheduled by the PSCCH do not overlap at all in the time domain, but completely overlap in the frequency domain. In this embodiment, the carrier frequency is in range R41. The range R41 may be determined by the UE according to a configuration from the base station, a pre-configuration or a standard definition. One feasible mechanism is that the range R41 is defined by the standard as below 6 GHz or below 6.5 GHz. The PSCCH transmission resource pool may allow only one subcarrier spacing. The UE may determine the one PSCCH subcarrier spacing allowed in the resource pool according to the configuration information of the PSCCH transmission resource pool. Allowing only one subcarrier spacing in the PSCCH transmission resource pool is helpful for reducing the complexity of the PSCCH detection by the receiving UE.

The resource pool for the PSSCH scheduled by the PSCCH allows multiple subcarrier spacings. In some examples, the PSSCH resource pool allows two subcarrier spacings, and the UE may determine specific values of the two subcarrier spacings according to a configuration from the base station, a pre-configuration or a standard definition. The transmitting UE may select the subcarrier spacing for the PSSCH according to a specific rule. One feasible rule is that: the UE determines the subcarrier spacing used for the PSSCH according to the transmitted traffic. If the target coverage of the transmitted traffic is greater than a certain threshold T41, the UE adopts a smaller one of the subcarrier spacings currently allowed in the PSSCH transmission resource pool, otherwise the UE adopts a larger one of the subcarrier spacings currently allowed in the PSSCH transmission resource pool. Another feasible rule is that: when the current congestion level in the transmission resource pool is greater than a certain threshold T42, the UE adopts a larger one of the subcarrier spacings currently allowed in the PSSCH transmission resource pool. The UE may determine T41 and T42 according to a configuration from the base station, a pre-configuration or a standard definition. The transmitting UE may also determine the multiple PSSCH subcarrier spacings allowed in the resource pool according to the configuration information of the PSSCH transmission resource pool.

According to the first implementation of the present embodiment, the UE determines the subcarrier spacings and slot structures for the PSCCH and the PSSCH in the following manner:

If the carrier frequency belongs to the first carrier frequency range R41, the subcarrier spacing allowed in the PSCCH transmission resource pool is 15 kHz, and the subcarrier spacings allowed in the resource pool for the PSSCH scheduled by the PSSCH are 15 kHz and 30 kHz. Each of the PSCCH and the PSCCH may be transmitted using an OFDM or SC-FDMA waveform with the normal CP, i.e. one slot containing 14 symbols. In some examples, each of the PSCCH and the PSCCH is transmitted using an OFDM waveform. If the subcarrier spacing for the PSSCH scheduled by the PSCCH is 15 kHz, each of the PSCCH and the PSSCH scheduled by the PSCCH occupies half a slot, i.e., the $1^{st}$ to $7^{th}$ OFDM symbols or the $8^{th}$ to $14^{th}$ OFDM symbols in one slot, wherein the first half of the first symbol in the half slot may be used to receive the Automatic Gain Control (AGC) for the UE, and the second half of the last symbol in the half slot may be used as a GAP for switching between transmitting and receiving.

In this implementation, the PSCCH occupies n41 consecutive OFDM symbols starting from t41 in the half slot, wherein t41 is a specific value indicating a time difference between the start of the PSCCH symbols and the start of the half slot, and is determined by the UE according to signaling received from the base station, a preconfiguration or a standard definition. One possible value of t41 is taken as $(2048+160)k \cdot T_c + T_c \leq t41 \leq (2048+160)k \cdot T_c + 4 \times (2048+140) k \cdot T_c + T_c$, such that the start of the PSCCH is between the $2^{nd}$ symbol and the $6^{th}$ symbol in the half slot, thereby avoiding the effect of the AGC time at the first symbol and the GAP time at the last symbol on the reception of the PSCCH. Another possible value of t41 is taken as $t41 = T_{AGC} + T_c$, wherein $T_{AGC}$ is a specific value indicating the time required for receiving the AGC adjustment for the UE under a normal situation. In some examples, $T_{AGC} = 2048 \ k \cdot \frac{1}{2} \cdot T_c + 144 \ k \cdot \frac{1}{2} \cdot T_c \cdot 160 \ k \cdot T_c$, wherein the length of $T_{AGC}$ is equal to the length of an OFDM or SC-FDMA symbol with a sub-carrier spacing of 30 kHz and a CP length of $16 \ k \cdot T_c + 144 \ k \cdot \frac{1}{2} \cdot T_c$, and the CP length of the first PSCCH symbol should be $144 \ k \cdot T_c$. This method can maximize consistency between the sidelink slot and the uplink/downlink slot structure. In other examples, $T_{AGC} = 2048 \ k \cdot \frac{1}{2} \cdot T_c + 144 \ k \cdot \frac{1}{2} \cdot T_c$, wherein the length of $T_{AGC}$ is equal to the length of an OFDM or SC-FDMA symbol with a sub-carrier spacing of 30 kHz and a CP length of $144 \ k \cdot \frac{1}{2} \cdot T_c$, and the CP length of the first PSCCH symbol should be $16 \ k \cdot T_c + 144 \ k \cdot T_c$. This method can increase the CP length of the PSCCH symbol and thus improve the coverage of the PSCCH. n41 is a specific value, and determined by the UE according to signaling received from the base station, a pre-configuration or a standard definition.

In the half slot, the first $2048 \ k \cdot \frac{1}{2} \cdot T_c + 16 \cdot T_c \cdot 144 \ k \cdot \frac{1}{2} \cdot T_c$ or $2048 \ k \cdot \frac{1}{2} \cdot T_c + 144 \ k \cdot \frac{1}{2} \cdot T_c$ is used as the AGC adjustment time. In some examples, the transmission power of the transmitting UE during the AGC adjustment time should be equal to the transmission power in the latest one OFDM or SC-FDMA symbol. In the half slot, the last $2048 \ k \cdot \frac{1}{2} \cdot T_c + 144 \ k \cdot \frac{1}{2} \cdot T_c$ is used as the GAP for switching between transmitting and receiving, during which the transmitting UE may transmit no signals. The transmitting UE may transmit the PSSCH in the half slot except for the AGC time, the GAP for switching between transmitting and receiving, and the time for transmitting the PSCCH symbols, wherein the subcarrier spacing for the PSSCH may be 15 kHz or 30 kHz.

According to the second implementation of the present embodiment, the UE determines the subcarrier spacings and slot structures for the PSCCH and the PSSCH in the following manner:

If the carrier frequency belongs to the first carrier frequency range R41, the subcarrier spacing allowed in the PSCCH transmission resource pool is 30 kHz, and the subcarrier spacings allowed in the resource pool for the PSSCH scheduled by the PSSCH are 30 kHz and 60 kHz. Each of the PSCCH and the PSCCH may be transmitted using an OFDM or SC-FDMA waveform with the extended CP, i.e. each slot containing 12 symbols. In some examples, each of the PSCCH and the PSCCH is transmitted using an OFDM waveform. If the subcarrier spacing for the PSSCH scheduled by the PSCCH is 30 kHz, each of the PSCCH and the PSSCH scheduled by the PSCCH occupies half a slot, i.e., the $1^{st}$ to $6^{th}$ OFDM symbols or the $7^{th}$ to $12^{th}$ OFDM symbols in one slot, wherein the first half of the first symbol in the half slot may be used to receive the Automatic Gain Control (AGC) for the UE, and the second half of the last symbol in the half slot may be used as a GAP for switching between transmitting and receiving.

In this implementation, the PSCCH occupies n42 consecutive OFDM symbols starting from t42 in the half slot, wherein t42 is a specific value indicating a time difference between the start of the PSCCH symbols and the start of the half slot, and is determined by the UE according to signaling received from the base station, a pre-configuration or a standard definition. One possible value of t42 is taken as $(2048+512)k \cdot \frac{1}{2} \cdot T_c + T_c \leq t42 \leq 4 \cdot (2048+512)k \cdot \frac{1}{2} \cdot T_c + T_c$, such that the start of the PSCCH is between the $2^{nd}$ symbol and the $5^{th}$ symbol in the half slot, thereby avoiding the effect of the AGC time at the first symbol and the GAP time at the last symbol on the reception of the PSCCH. Another possible value of t42 is taken as $t42 = T_{AGC} + T_c$, wherein $T_{AGC}$ is a specific value indicating the time required for receiving the AGC adjustment for the UE under a normal situation. In some examples, $T'_{AGC} = 2048 \ k \cdot \frac{1}{4} \cdot T_c + 512 \ k \cdot \frac{1}{4} \cdot T_c$, wherein the length of $T_{AGC}$ is equal to the length of an OFDM or SC-FDMA symbol with a sub-carrier spacing of 60 kHz and a CP length of $512 \ k \cdot \frac{1}{4} \cdot T_c$, and the CP length of the first PSCCH symbol should be $512 \ k \cdot T_c \cdot \frac{1}{2} \cdot n42$ is a specific value, and determined by the UE according to signaling received from the base station, a pre-configuration or a standard definition.

In the half slot, the first $2048 \cdot \frac{1}{4} \cdot T_c + 512 \ k \cdot \frac{1}{4} \cdot T_c$ is used as the AGC adjustment time. In some examples, the transmission power of the transmitting UE during the AGC adjustment time should be equal to the transmission power in the latest one OFDM or SC-FDMA symbol. In the half slot, the last $2048 \ k \cdot \frac{1}{4} \cdot T_c + 512 \ k \cdot \frac{1}{4} \cdot T_c$ is used as the GAP for switching between transmitting and receiving, during which the transmitting UE may transmit no signals. The transmitting UE may transmit the PSSCH in the half slot except for the AGC time, the GAP for switching between transmitting and receiving, and the time for transmitting the PSCCH symbols, wherein the subcarrier spacing for the PSSCH may be 30 kHz or 60 kHz.

In some examples, if more than one PSSCH subcarrier spacings are allowed in the resource pool, the scheduled PSSCH subcarrier spacing should be indicated in the PSCCH.

In this embodiment, if the UE uses the downlink synchronization signal transmitted by the base station as the reference synchronization source, and the UE starts to transmit the PSCCH and the PSSCH at the $i^{th}$ symbol in the $n^{th}$ slot, the start time for the UE transmitting the PSCCH and the PSSCH should be in advance of the start of the OFDM or SC-FDMA symbol in the $n^{th}$ downlink slot by $\Delta$ second(s). According to one implementation of the present embodiment, $\Delta = D/C$, where D is the distance between the UE and the base station, C is the speed of light, i.e. $3 \times 10^8$ m/s. The value of D may be calculated by the RRC or MAC layer of the UE using the current GNSS coordinates of the UE and the GNSS coordinates of the base station, wherein the UE may acquire the GNSS coordinates of the base station by receiving the broadcast message from the base station. According to another implementation of the present embodiment of the present disclosure, $\Delta=(T_{UE}-T_{NB}) \bmod L$, where $T_{UE}$ is the UTC timing corresponding to the start of the $n^{th}$ downlink slot at the UE side, and the $T_{NB}$ is the reference UTC timing obtained by the UE receiving the broadcast message from the base station. In some examples, the reference UTC timing is a start of a certain system frame of the base station in the history, L is the length of the slot, and the units of both of $(T_{UE}-T_{NB})$ and L are Tc.

Embodiment V

In this embodiment, the subcarrier spacing for the PSCCH may be different from the subcarrier spacing for the PSSCH scheduled by the PSCCH, and the PSCCH and the PSSCH scheduled by the PSCCH are multiplexed in a time division mode, that is, the time-frequency resource for the PSCCH and the time-frequency resource for the PSSCH scheduled by the PSCCH do not overlap at all in the time domain, but completely overlap in the frequency domain. In this embodiment, the carrier frequency is in range R51. The range R51 may be determined by the UE according to a configuration from the base station, a pre-configuration or a standard definition. One feasible mechanism is that the range R51 defined by the standard as above 6 GHz or above 6.5 GHz. The PSCCH transmission resource pool may allow only one subcarrier spacing. The UE may determine the one PSCCH subcarrier spacing allowed in the resource pool according to the configuration information of the PSCCH transmission resource pool. Allowing only one subcarrier spacing in the PSCCH transmission resource pool is helpful for reducing the complexity of the PSCCH detection by the receiving UE.

The resource pool for the PSSCH scheduled by the PSCCH allows multiple subcarrier spacings. In some examples, the PSSCH resource pool allows two subcarrier spacings, and the UE may determine specific values of the two subcarrier spacings according to a configuration from the base station, a pre-configuration or a standard definition. The transmitting UE may select the subcarrier spacing for the PSSCH according to a specific rule. One feasible rule is that: the UE determines the subcarrier spacing used for the PSSCH according to the transmitted traffic. If the target coverage of the transmitted traffic is greater than a certain threshold T51, the UE adopts a smaller one of the subcarrier spacings currently allowed in the PSSCH transmission resource pool, otherwise the UE adopts a larger one of the subcarrier spacings currently allowed in the PSSCH transmission resource pool. Another feasible rule is that: when the current congestion level in the transmission resource pool is greater than a certain threshold T52, the UE adopts a larger one of the subcarrier spacings currently allowed in the PSSCH transmission resource pool. The UE may determine T51 and T52 according to a configuration from the base station, a pre-configuration or a standard definition. The transmitting UE may also determine the multiple PSSCH subcarrier spacings allowed in the resource pool according to the configuration information of the PSSCH transmission resource pool.

In one feasible implementation, the UE determines the subcarrier spacings and slot structures for the PSCCH and the PSSCH in the following manner:

If the carrier frequency belongs to the first carrier frequency range R51, the subcarrier spacing allowed in the PSCCH transmission resource pool is 60 kHz, and the subcarrier spacings allowed in the resource pool for the PSSCH scheduled by the PSSCH are 60 kHz and 120 kHz. Each of the PSCCH and the PSCCH may be transmitted using an OFDM or SC-FDMA waveform with the extended CP, i.e. one slot containing 12 symbols. In some examples, each of the PSCCH and the PSSCH is transmitted using an OFDM waveform. If the subcarrier spacing for the PSSCH scheduled by the PSCCH is 60 kHz, each of the PSCCH and the PSSCH scheduled by the PSCCH occupies half a slot, i.e., the $1^{st}$ to $6^{th}$ OFDM symbols or the $7^{th}$ to $12^{th}$ OFDM symbols in one slot, wherein the first half of the first symbol in the half slot may be used to receive the Automatic Gain Control (AGC) for the UE, and the second half of the last symbol in the half slot may be used as a GAP for switching between transmitting and receiving.

In this implementation, the PSCCH occupies n52 consecutive OFDM symbols starting from T52 in the half slot, wherein T52 is a specific value indicating a time difference between the start of the PSCCH symbols and the start of the half slot, and is determined by the UE according to signaling received from the base station, a preconfiguration or a standard definition. One possible value of T52 is taken as $(2048+512)k \cdot \frac{1}{4} \cdot T_c + T_c \le t52 \le 4 \cdot (2048+512)k \cdot \frac{1}{2} \cdot T_c + T_c$, such that the start of the PSCCH is between the $2^{nd}$ symbol and the $5^{th}$ symbol in the half slot, thereby avoiding the effect of the AGC time at the first symbol and the GAP time at the last symbol on the reception of the PSCCH. Another possible value of T52 is taken as $t52=T''_{AGC}+T_c$, wherein $T''_{AGC}$ is a specific value indicating the time required for receiving the AGC adjustment for the UE under a normal situation. In some examples, $T'_{AGC}=2048\ k \cdot \frac{1}{8} \cdot T_c + 512\ k \cdot \frac{1}{8} \cdot T_c$, wherein the length of $T''_{AGC}$ is equal to the length of an OFDM or SC-FDMA symbol with a sub-carrier spacing of 120 kHz and a CP length of $512\ k \cdot \frac{1}{8} \cdot T_c$, and the CP length of the first PSCCH symbol should be $512\ k \cdot T_c \sim \frac{1}{4} \cdot n52$ is a specific value, and determined by the UE according to signaling received from the base station, a pre-configuration or a standard definition.

In the half slot, the first $2048\ k \cdot \frac{1}{8} \cdot T_c + 512\ k \cdot \frac{1}{8} \cdot T_c$ is used as the AGC adjustment time. In some examples, the transmission power of the transmitting UE during the AGC adjustment time should be equal to the transmission power in the latest one OFDM or SC-FDMA symbol. In the half slot, the last $2048\ k \sim \frac{1}{8} \cdot T_c + 512\ k \sim \frac{1}{8} \cdot T_c$ is used as the GAP for switching between transmitting and receiving, during which the transmitting UE may transmit no signals. The transmitting UE may transmit the PSSCH in the half slot except for the AGC time, the GAP for switching between transmitting and receiving, and the time for transmitting the PSCCH symbols, wherein the subcarrier spacing for the PSSCH may be 60 kHz or 120 kHz.

In some examples, if more than one PSSCH subcarrier spacings are allowed in the resource pool, the scheduled PSSCH subcarrier spacing should be indicated in the PSCCH.

In this embodiment, if the UE uses the downlink synchronization signal transmitted by the base station as the reference synchronization source, and the UE starts to transmit the PSCCH and the PSSCH at the $i^{th}$ symbol in the $n^{th}$ slot, the start time for the UE transmitting the PSCCH and the PSSCH should be in advance of the start of the $i^{th}$ OFDM or SC-FDMA symbol in the $n^{th}$ downlink slot by $\Delta$ second(s). According to one implementation of the present embodiment, $\Delta=D/C$, where D is the distance between the UE and the base station, C is the speed of light, i.e. $3\times108$ m/s. The value of D may be calculated by the RRC or MAC layer of the UE using the current GNSS coordinates of the UE and the GNSS coordinates of the base station, wherein the UE may acquire the GNSS coordinates of the base station by receiving the broadcast message from the base station. According to another implementation of the present embodiment of the present disclosure, $\Delta=(T_{UE}-T_{NB}) \bmod L$, where $T_{UE}$ is the UTC timing corresponding to the start of the $n^{th}$ downlink slot at the UE side, and the $T_{NB}$ is the reference UTC timing obtained by the UE receiving the broadcast message from the base station. In some examples, the reference UTC timing is a start of a certain system frame of the base station in the history, L is the length of the slot, and the units of both of $(T_{UE}-T_{NB})$ and L are Tc.

Figure 3:
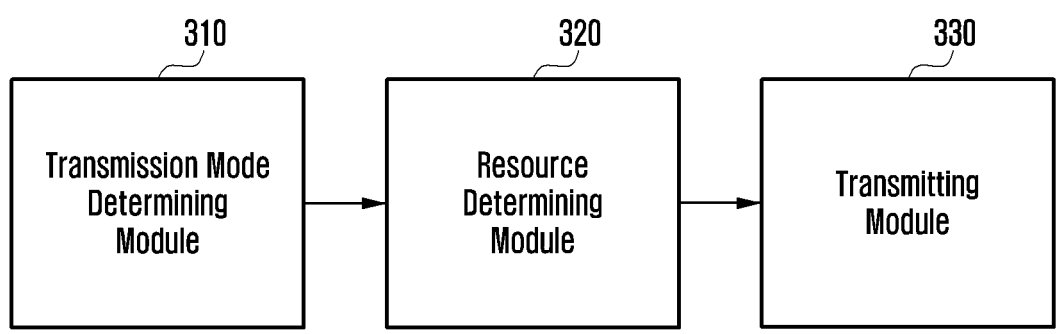
FIG. 3 shows a schematic block diagram of a device for transmitting a sidelink signal in accordance with an embodiment of the present disclosure.

FIG. 3 shows a schematic block diagram of a device for transmitting a sidelink signal in accordance with an embodiment of the present disclosure. This device may be a UE.

As shown in FIG. 3, the device may comprise a transmission mode determining module 310, a resource determining module 320 and a transmitting module 330.

The transmission mode determining module 310 is configured to determine a Physical Sidelink Control CHannel (PSCCH) transmission mode allowed in a PSCCH transmission resource pool and a Physical Sidelink Shared CHannel (PSSCH) transmission mode allowed in a PSSCH transmission resource pool, respectively.

As used herein, the PSCCH transmission resource pool refers to a set of transmission modes and time-frequency resources that may be used for transmitting the PSCCH, and the PSSCH transmission resource pool refers to a set of transmission modes and time-frequency resources that may be used for transmitting the PSSCH. The transmission mode in the PSCCH transmission resource pool or the transmission mode in the PSSCH transmission resource pool may comprise at least one of the following parameters: time-frequency resource locations comprised in the transmission resource pool, PSCCH or PSSCH sub-carrier spacings allowed in the transmission resource pool, and PSCCH or PSSCH multiplexing modes in the transmission resource pool, PSCCH or PSSCH CP lengths allowed in the transmission resource pool, numbers and locations of PSCCH or PSSCH DMRS symbols allowed in the transmission resource pool, PSCCH or PSSCH transmission timing employed in the transmission resource pool, and PSCCH and PSSCH waveforms employed in the transmission resource pool, and etc. . . . . The transmission timing may be downlink timing of a base station, uplink timing of a base station, or global positioning system (GNSS) timing. The waveforms may be of Orthogonal Frequency Division Multiplexing (OFDM) or SC-FDMA. The UE may determine a transmission mode from the transmission resource pool by receiving signaling from the base station or by a pre-configuration. In some examples, the transmission mode may also be referred to as "configuration". For example, a configuration in the PSCCH transmission resource pool may refer to a PSCCH transmission mode allowed in the PSCCH transmission resource pool. A configuration in the PSSCH transmission resource pool may refer to a PSSCH transmission mode in the PSSCH transmission resource pool.

The resource determining module 320 is configured to determine a resource for transmitting a PSCCH and a resource for transmitting a PSSCH from the PSCCH transmission resource pool and the PSSCH transmission resource pool respectively.

At least one of the following parameters may be determined and used to transmit the PSCCH/PSSCH: the subcarrier spacing, the CP length, the number and location of DMRS symbols, the transmission timing, and the waveform, and the like. If a parameter in the configuration of the PSCCH or PSSCH transmission resource pool can take multiple values, the UE may select a value from the multiple values according to a specific rule, which may be configured by the base station, pre-configured or defined by a standard.

The transmitting module 320 is configured to transmit the PSCCH according to the determined PSCCH transmission mode and the resource for transmitting the PSCCH and transmit the PSSCH according to the determined PSSCH transmission mode and the resource for transmitting the PSSCH.

In some embodiments, the allowed PSCCH transmission mode and the allowed PSSCH transmission mode comprise a subcarrier spacing, the PSCCH transmission resource pool allows only one subcarrier spacing for one carrier frequency, and the PSSCH transmission resource pool allows more than one subcarrier spacing for one carrier frequency.

In some embodiments, a first subcarrier spacing is used for transmitting the PSSCH when a target coverage of traffic transmitted using the sidelink signal is greater than a predetermined threshold, and a second subcarrier spacing is used for transmitting the PSSCH when the target coverage of traffic transmitted using the sidelink signal is no great than the predetermined threshold, and wherein the first subcarrier spacing is smaller than the second subcarrier spacing.

In some embodiments, a first subcarrier spacing is used for transmitting the PSSCH when a current congestion level in the PSSCH transmission resource pool is greater than a predetermined threshold, and a second subcarrier spacing is used for transmitting the PSSCH when the current congestion level in the PSSCH transmission resource pool is no great than the predetermined threshold.

In some embodiments, the resource determining module 320 is further configured to indicate the subcarrier spacing for the PSSCH in the transmitted PSCCH.

In some embodiments, the subcarrier spacing used for transmitting the PSSCH is same as the subcarrier spacing used for transmitting the PSCCH. The subcarrier spacing used for transmitting the PSSCH is determined based on the carrier frequency of the traffic transmitted using the sidelink signal.

In some embodiments, the allowed PSCCH transmission mode and the allowed PSSCH transmission mode comprise a cyclic prefix (CP). In such a case, the CP used for transmitting the PSCCH is same as the CP used for transmitting the PSSCH. Alternatively, the CP used for transmitting the PSCCH is an extended CP, and the CP used for transmitting the PSSCH is a normal CP.

In some embodiments, the transmission power in adjustment time for Automatic Gain Control (AGC) is equal to the transmission power in the latest one Orthogonal Frequency Division Multiplexing (OFDM) or Single-Carrier Frequency-Division Multiple Access (SC-FDMA) symbol.

In some embodiments, the PSCCH and the PSSCH are multiplexed in a frequency division mode, wherein each PSCCH occupies half a time slot, and the number of symbols occupied by the PSSCH depends on the subcarrier spacing for the PSSCH. Alternatively, the PSCCH and the PSSCH are multiplexed in a time division mode, wherein a start of a first PSCCH symbol in one slot is after the Automatic Gain Control (AGC) time.

In some embodiments, the transmitting module 330 may further configured to make the start time for transmitting the PSCCH and the PSSCH in advance of the start of the $i^{th}$ OFDM or SC-FDMA symbol in the $n^{th}$ downlink slot by a specific time amount when starting to transmit the PSCCH and the PSSCH at the $i^{th}$ symbol in the $n^{th}$ slot. In some examples, the specific time amount is $\Delta$ seconds:

$$\Delta = D/C,$$

where D is a distance between the user equipment (UE) and the base station being a reference synchronization source, C is the speed of light and has a value of 3×108 m/s, and the value of D is calculated by the UE using current Global Positioning System (GNSS) coordinates of the UE and GNSS coordinates of the base station being the reference synchronization source.

It should be noted that the structure shown in FIG. 3 is only a schematic block diagram provided to illustrate the technical solution of the embodiment of the present disclosure. In particular implementations, the modules shown in FIG. 3 may be combined or further divided as required, or the device shown in FIG. 3 may have more modules for implementing other functions as required. Therefore, the structure shown in FIG. 3 should not be construed as limiting the scope of the disclosure.

Figure 4:
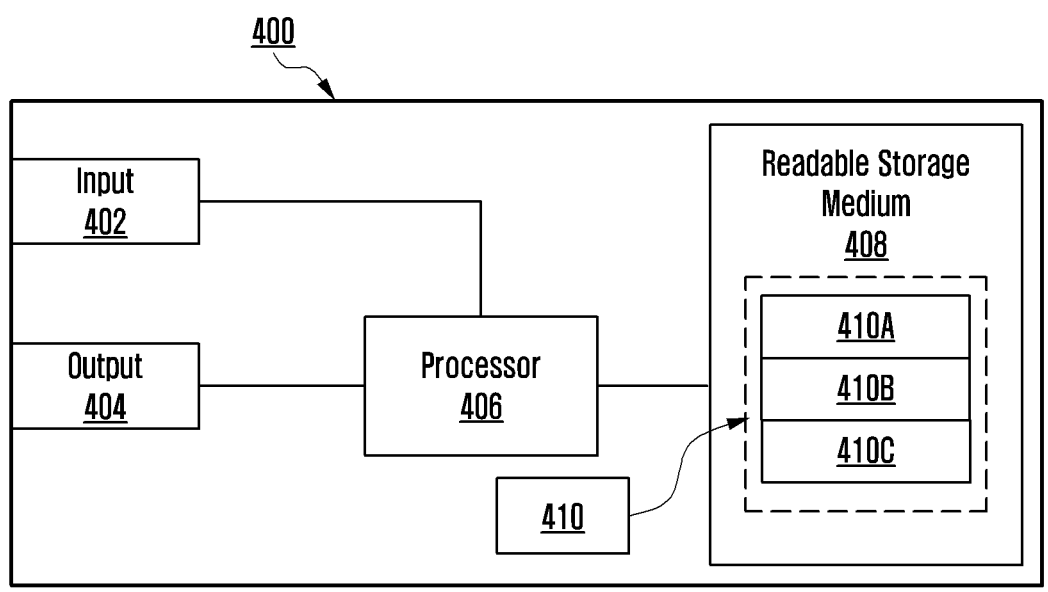
FIG. 4 is a block diagram showing an example hardware arrangement of an example device in accordance with an embodiment of the present disclosure.

FIG. 4 is a block diagram of an example hardware arrangement of an example device in accordance with an embodiment of the present disclosure. The hardware arrangement 400 may comprise a processor 406. The processor 406 may be a single processing unit or a plurality of processing units for performing various actions in the processes described herein. The arrangement 400 may also comprise an input unit 410 for receiving signals from other entities, and an output unit 404 for providing signals to other entities. The input unit 410 and output unit 404 may be arranged as a single entity or as separate entities.

In addition, the arrangement 400 may comprise at least one readable storage medium 408 in the form of a non-volatile or volatile memory, such as electrically erasable programmable read only memory (EEPROM), flash memory, optical disk, Blu-ray disk, and/or hard disk drive. The readable storage medium 408 may comprise a computer program 410, which may include codes/computer readable instructions which, when executed by the processor 406 in the arrangement 400, enable the hardware arrangement 400 and/or a device comprising the hardware arrangement 400 to perform any one of the processes described above in connection with FIG. 1 and/or FIG. 2 and variations thereof.

The computer program 410 may be configured as computer program codes having an architecture consisted of computer program modules 410A-410C, for example. Thus, in an example embodiment in which the hardware arrangement 400 is used as a user equipment, the codes in the computer program of the arrangement 400 may be used to perform the method as shown in FIG. 2. However, the computer program 410 may further comprise other modules for performing respective steps of respective methods described herein.

The computer program modules may substantially perform respective actions in the processes illustrated in FIG. 1 and/or FIG. 2 to simulate respective devices. In other words, when different computer program modules are executed in the processor 406, they may correspond to different units of different devices mentioned herein.

Although the code means in the embodiment disclosed above in connection with FIG. 4 is implemented as computer program modules which, when executed in the processor 406, cause the hardware arrangement 400 to perform the actions described above in connection with FIG. 2, in an alternative embodiment, at least one of the code means may be at least partially implemented as a hardware circuit.

The processor may be a single CPU (Central Processing Unit), but may also include two or more processing units. For example, a processor may include a general purpose microprocessor, an instruction set processor, and/or a related chipset and/or a special purpose microprocessor (e.g., an application-specific integrated circuit (ASIC)). The processor may also include an onboard memory for caching purposes. The computer program may be carried by a computer program product coupled to the processor. The computer program product may comprise a computer readable medium having a computer program stored thereon. For example, the computer program product may be a flash memory, a random access memory (RAM), a read only memory (ROM) or an EEPROM, and the computer program modules described above may be distributed to different computer program products in the form of a memory within the UE in alternative embodiments.

The present disclosure has been described in connection with the preferred embodiments. It will be appreciated by the skilled in the art that various other modifications, substitutions and additions may be made without departing from the spirit and scope of the present disclosure. Therefore, the scope of the present disclosure is not limited to the specific embodiments described above, but is defined by the appended claims.

Furthermore, the functions described herein as being implemented by pure hardware, software, and/or firmware may also be implemented by means of dedicated hardware, a combination of general-purpose hardware and software, and the like. For example, functions described as being implemented by dedicated hardware (e.g., Field Programmable Gate Array (FPGA), Application Specific Integrated Circuit (ASIC), etc.) may be implemented by general purpose hardware (e.g., central processing unit (CPU), digital signal processing (DSP)) in connection with software, and vice versa.

The invention claimed is:

1. A method performed by a device for transmitting a sidelink signal, the method comprising:
   identifying a transmission mode for a physical sidelink control channel (PSCCH) allowed in a PSCCH transmission resource pool and a transmission mode for a physical sidelink shared channel (PSSCH) allowed in a PSSCH transmission resource pool;
   in case that the identified transmission mode is a subcarrier spacing, identifying a subcarrier spacing among a plurality subcarrier spacings which are allowed for transmitting the PSCCH for one carrier frequency, and identifying a predetermined subcarrier spacing allowed for transmitting the PSCCH for one carrier frequency;
   determining a first resource for the PSCCH based on the PSCCH resource pool, and a second resource for the PSSCH based on the PSSCH resource pool; and
   transmitting the PSCCH based on the predetermined subcarrier spacing and the first resource, and transmitting the PSSCH based on the identified subcarrier spacing and the second resource,
   wherein the subcarrier spacing for transmitting the PSSCH is identified from the plurality of the subcarrier spacings based on a target coverage of traffic for the sidelink signal, a congestion level in the PSSCH transmission resource pool, or a carrier frequency range.

2. The method of claim 1,
   wherein a first subcarrier spacing is determined for transmitting the PSSCH in case that the target coverage of the traffic for the sidelink signal is greater than a predetermined threshold, and a second subcarrier spacing is determined for transmitting the PSSCH in case that the target coverage of the traffic for the sidelink signal is no greater than the predetermined threshold, and wherein the first subcarrier spacing is smaller than the second subcarrier spacing.

3. The method of claim 1,
wherein a first subcarrier spacing is determined for transmitting the PSSCH in case that the congestion level in the PSSCH transmission resource pool is greater than a predetermined threshold, and a second subcarrier spacing is determined for transmitting the PSSCH in case that the congestion level in the PSSCH transmission resource pool is no greater than the predetermined threshold.

4. The method of claim 1, in case that the identified transmission mode is a cyclic prefix (CP), further comprising:
determining a first CP used for transmitting the PSCCH is and a second CP used for transmitting the PSSCH, and
wherein the first CP is same as the second CP, or the first CP is an extended CP and the second CP is a normal CP.

5. The method of claim 1,
wherein, in case that the PSCCH and the PSSCH are multiplexed in a frequency division mode, the first resource for each PSCCH occupies half a time slot, and the second resource for the PSSCH is a number of symbols, the number of symbols being based on the identified subcarrier spacing for the PSSCH, and
wherein, in case that the PSCCH and the PSSCH are multiplexed in a time division mode, a start of a first PSCCH symbol in one slot is after an automatic gain control (AGC) time.

6. The method of claim 1, wherein transmissions of the PSCCH and the PSSCH is initiated in advance of a start point of an $i^{th}$ symbol in an $n^{th}$ downlink slot by a specific time duration.

7. The method of claim 6,
wherein the specific time duration is $\Delta$ seconds,
wherein $\Delta=D/C$, and
wherein D is a distance between a user equipment (UE) and a base station being a reference synchronization source, C is the speed of light and has a value of $3\times10^8$ m/s, and the value of D is calculated by the UE using current Global Positioning System (GNSS) coordinates of the UE and GNSS coordinates of the base station being the reference synchronization source.

8. A device for transmitting a sidelink signal, the device comprising:
a transceiver; and
a processor configured to:
identify a transmission mode for a physical sidelink control channel (PSCCH) allowed in a PSCCH transmission resource pool and a transmission mode for a physical sidelink shared channel (PSSCH) allowed in a PSSCH transmission resource pool,
in case that the identified transmission mode is a subcarrier spacing, identify a subcarrier spacing among a plurality subcarrier spacings which are allowed for transmitting the PSCCH for one carrier frequency, and identify a predetermined subcarrier spacing allowed for transmitting the PSCCH for one carrier frequency,
determine a first resource for the PSCCH based on the PSCCH resource pool, and a second resource for the PSSCH based on the PSSCH resource pool, and
control the transceiver to transmit the PSCCH based on the predetermined subcarrier spacing and the first resource, and transmitting the PSSCH based on the identified subcarrier spacing and the second resource,
wherein the subcarrier spacing for transmitting the PSSCH is identified from the plurality of the subcarrier spacings based on a target coverage of traffic for the sidelink signal, a congestion level in the PSSCH transmission resource pool, or a carrier frequency range.

9. The device of claim 8,
wherein the processor is further configured to determine a first subcarrier spacing for transmitting the PSSCH in case that the target coverage of the traffic for the sidelink signal is greater than a predetermined threshold, and a second subcarrier spacing for transmitting the PSSCH in case that the target coverage of the traffic for the sidelink signal is no greater than the predetermined threshold, and
wherein the first subcarrier spacing is smaller than the second subcarrier spacing.

10. The device of claim 8,
wherein the processor is further configured to determine a first subcarrier spacing for transmitting the PSSCH in case that the congestion level in the PSSCH transmission resource pool is greater than a predetermined threshold, and a second subcarrier spacing for transmitting the PSSCH in case that the congestion level in the PSSCH transmission resource pool is no greater than the predetermined threshold.

11. The device of claim 8,
wherein, in case that the identified transmission mode is a cyclic prefix (CP), the processor is further configured to determine a first CP used for transmitting the PSCCH is and a second CP used for transmitting the PSSCH, and
wherein the first CP is same as the second CP, or the first CP is an extended CP and the second CP is a normal CP.

12. The device of claim 8,
wherein, in case that the PSCCH and the PSSCH are multiplexed in a frequency division mode, the first resource for each PSCCH occupies half a time slot, and the second resource for the PSSCH is a number of symbols, the number of symbols being based on the identified subcarrier spacing for the PSSCH, and
wherein, in case that the PSCCH and the PSSCH are multiplexed in a time division mode, a start of a first PSCCH symbol in one slot is after an automatic gain control (AGC) time.

13. The device of claim 8,
wherein transmissions of the PSCCH and the PSSCH is initiated in advance of a start point of an $i^{th}$ symbol in an $n^{th}$ downlink slot by a specific time duration,
wherein the specific time duration is $\Delta$ seconds,
wherein $\Delta=D/C$, and
wherein D is a distance between a user equipment (UE) and a base station being a reference synchronization source, C is the speed of light and has a value of $3\times10^8$ m/s, and the value of D is calculated by the UE using current Global Positioning System (GNSS) coordinates of the UE and GNSS coordinates of the base station being the reference synchronization source.

* * * * *